(12) United States Patent
Baik

(10) Patent No.: US 12,557,518 B2
(45) Date of Patent: Feb. 17, 2026

(54) DISPLAY APPARATUS

(71) Applicant: LG DISPLAY CO., LTD., Seoul (KR)

(72) Inventor: Seungmin Baik, Paju-si (KR)

(73) Assignee: LG Display Co., Ltd (KR)

(*) Notice: Subject to any disclaimer, the term of this patent is extended or adjusted under 35 U.S.C. 154(b) by 617 days.

(21) Appl. No.: 18/072,512

(22) Filed: Nov. 30, 2022

(65) Prior Publication Data

US 2023/0189613 A1    Jun. 15, 2023

(30) Foreign Application Priority Data

Dec. 10, 2021 (KR) .................. 10-2021-0176433

(51) Int. Cl.
*H10K 59/38* (2023.01)
*H10K 50/84* (2023.01)
*H10K 59/35* (2023.01)

(52) U.S. Cl.
CPC ............. *H10K 59/38* (2023.02); *H10K 50/84* (2023.02); *H10K 59/353* (2023.02)

(58) Field of Classification Search
CPC ....... H10K 59/38; H10K 59/353; H10K 50/84
See application file for complete search history.

(56) References Cited

U.S. PATENT DOCUMENTS

| | | | | |
|---|---|---|---|---|
| 10,725,333 B2* | 7/2020 | Kim | ................ | G02F 1/136286 |
| 2011/0025199 A1 | 2/2011 | Park et al. | | |
| 2014/0312339 A1* | 10/2014 | Fujita | .................... | H10K 59/35 |
| | | | | 257/40 |
| 2019/0214440 A1* | 7/2019 | Lee | ................... | H10K 59/122 |
| 2019/0341428 A1 | 11/2019 | Lee et al. | | |
| 2020/0043983 A1* | 2/2020 | Kim | ................... | H10K 59/38 |
| 2020/0258944 A1* | 8/2020 | Joo | .................... | H10K 59/8792 |
| 2021/0384271 A1* | 12/2021 | Ahn | ................... | H10K 71/70 |

(Continued)

FOREIGN PATENT DOCUMENTS

| CN | 1426269 A | 6/2003 |
|---|---|---|
| CN | 110783375 A | 2/2020 |

(Continued)

OTHER PUBLICATIONS

Office Action in Korean Appln. No. 10-2021-0176433, mailed on Aug. 13, 2025, 18 pages (with English translation).

(Continued)

*Primary Examiner* — Mary Ellen Bowman
(74) *Attorney, Agent, or Firm* — Fish & Richardson P.C.

(57) ABSTRACT

A display apparatus includes a substrate provided with a plurality of subpixels, a first electrode provided in each of the plurality of subpixels on the substrate, a fence provided for each of the plurality of subpixels while surrounding an edge of the first electrode, a light emitting layer provided on the first electrode and the fence, a second electrode provided on the light emitting layer, and a color filter provided in each of the plurality of subpixels on the second electrode, wherein the color filter includes a first filter spaced apart from the second electrode at a first distance, and a second filter spaced apparat from the second electrode at a second distance shorter than the first distance, and the second filter may be disposed on a lower surface of the first filter to surround an edge of the first filter, thereby preventing a color mixture of adjacent subpixels.

20 Claims, 10 Drawing Sheets

(56) References Cited

U.S. PATENT DOCUMENTS

| | | | | |
|---|---|---|---|---|
| 2022/0231200 A1* | 7/2022 | Kim | ....................... | H10K 59/38 |
| 2023/0263008 A1* | 8/2023 | Lee | ....................... | H10K 71/00 |
| | | | | 257/91 |
| 2024/0341141 A1* | 10/2024 | Bang | .................... | H10K 59/126 |

FOREIGN PATENT DOCUMENTS

| | | | |
|---|---|---|---|
| CN | 113725384 | A | 11/2021 |
| JP | 2009-0104969 | A | 5/2009 |
| KR | 2006-0104496 | A | 10/2006 |
| KR | 20200014199 | A | 2/2020 |
| KR | 2020-0073579 | A | 6/2020 |
| KR | 20200097373 | A | 8/2020 |

OTHER PUBLICATIONS

Office Action in Chinese Appln. No. 202211193693.1, mailed on Jan. 15, 2026, 14 pages (with English translation).

* cited by examiner

DISPLAY APPARATUS

CROSS-REFERENCE TO RELATED APPLICATION

This application claims the priority of Korean Patent Application No. 10-2021-0176433 filed on Dec. 10, 2021, which is hereby incorporated by reference in its entirety.

BACKGROUND

Field of the Disclosure

The present disclosure relates to a display apparatus for displaying an image.

Description of the Background

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Among the display apparatuses, the organic light emitting display apparatus and the quantum dot light emitting display apparatus are self-light emitting types and have advantages in that a viewing angle and a contrast ratio are more excellent than those of the liquid crystal display (LCD) apparatus. Also, since the organic light emitting display apparatus and the quantum dot light emitting display apparatus do not require a separate backlight, it is advantageous that the display apparatuses are able to be thin and lightweight and have low power consumption.

Recently, a head mounted display device that provides a service of virtual reality (VR), in which a focal point is formed on a close distance in front of eyes of a user, by using an organic light emitting display device has been developed. However, in case of the head mounted display device, it is difficult to manufacture a mask due to a dense pixel interval of high resolution, and it is also difficult to precisely align the mask.

Therefore, the head mounted display device is implemented to emit light of a color different for each pixel by disposing a color filter on a white organic light emitting layer after the organic light emitting layer is commonly formed in a plurality of pixels without a mask. However, in case of a display device of high resolution, it is difficult to form a black matrix between the plurality of pixels due to a dense pixel interval, whereby a problem occurs in that a color mixture occurs between adjacent pixels.

The above information disclosed in this Background section is only for enhancement of understanding of the background of the described technology and therefore it may contain information that does not form prior art that is already known to a person of ordinary skill in the art.

SUMMARY

Accordingly, the present disclosure has been made in view of the above problems and is to provide a display apparatus that may prevent a color mixture of adjacent subpixels from occurring.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display apparatus includes a substrate provided with a plurality of subpixels, a first electrode provided in each of the plurality of subpixels on the substrate, a fence provided for each of the plurality of subpixels while surrounding an edge of the first electrode, a light emitting layer provided on the first electrode and the fence, a second electrode provided on the light emitting layer, and a color filter provided in each of the plurality of subpixels on the second electrode, wherein the color filter includes a first filter spaced apart from the second electrode at a first distance, and a second filter spaced apart from the second electrode at a second distance shorter than the first distance, and the second filter may be disposed on a lower surface of the first filter to surround an edge of the first filter.

In accordance with another aspect of the present disclosure, a display apparatus includes a substrate provided with a plurality of subpixels, a first electrode provided in each of the plurality of subpixels on the substrate, a fence provided for each of the plurality of subpixels while surrounding an edge of the first electrode, a light emitting layer provided on the first electrode and the fence, a second electrode provided on the light emitting layer, an encapsulation layer disposed on the second electrode, and a color filter provided in each of the plurality of subpixels on the encapsulation layer, wherein the color filter includes a first filter provided to be wider than the first electrode, and a second filter disposed on a lower surface of the first filter and provided to be narrower than the first filter, and the encapsulation layer may be disposed to surround the second filter.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
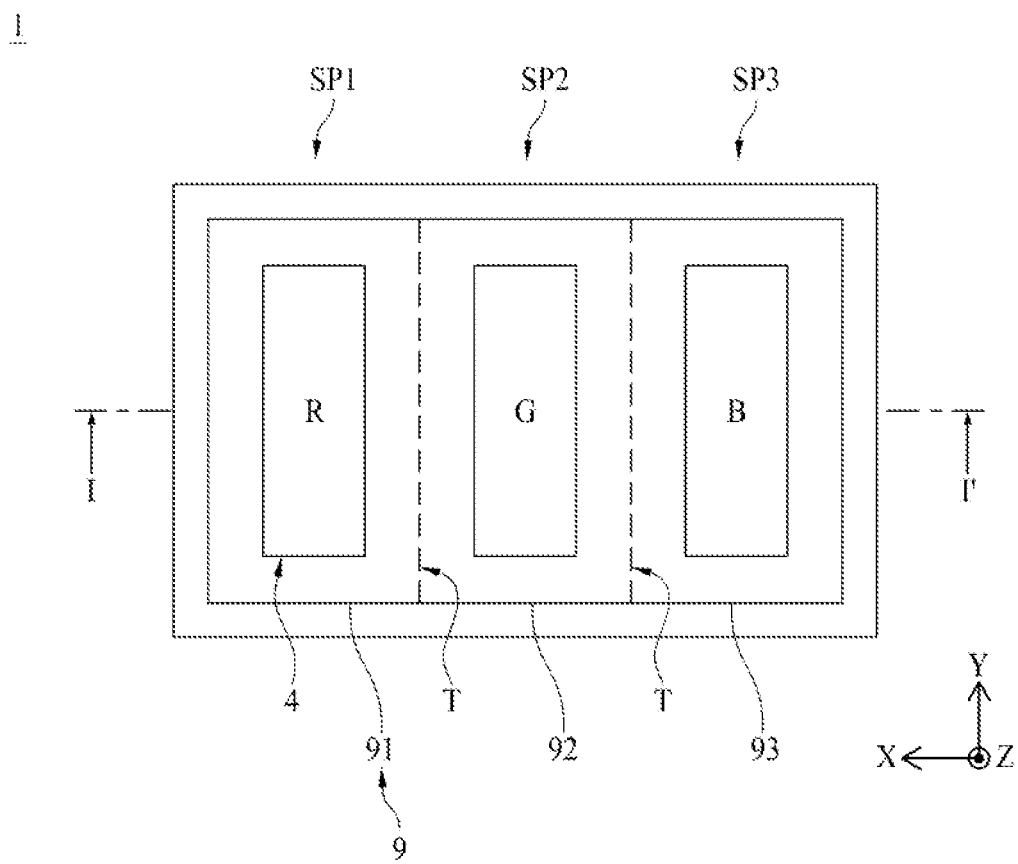
FIG. 1 is a schematic plane view illustrating a display apparatus according to one aspect of the present disclosure.

Reference will now be made in detail to the aspects of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following aspects described with reference to the accompanying drawings.

The present disclosure may, however, be embodied in different forms and should not be construed as limited to the aspects set forth herein. Rather, these aspects are provided so that this disclosure will be thorough and complete, and will fully convey the scope of the present disclosure to those skilled in the art.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various aspects of the present disclosure may be partially or overall coupled to or combined with each other and may be variously inter-operated with each other and driven technically as those skilled in the art can sufficiently understand. The aspects of the present disclosure may be carried out independently from each other or may be carried out together in co-dependent relationship.

Hereinafter, various aspects of the present disclosure will be described in detail with reference to the accompanying drawings.

Figure 2:
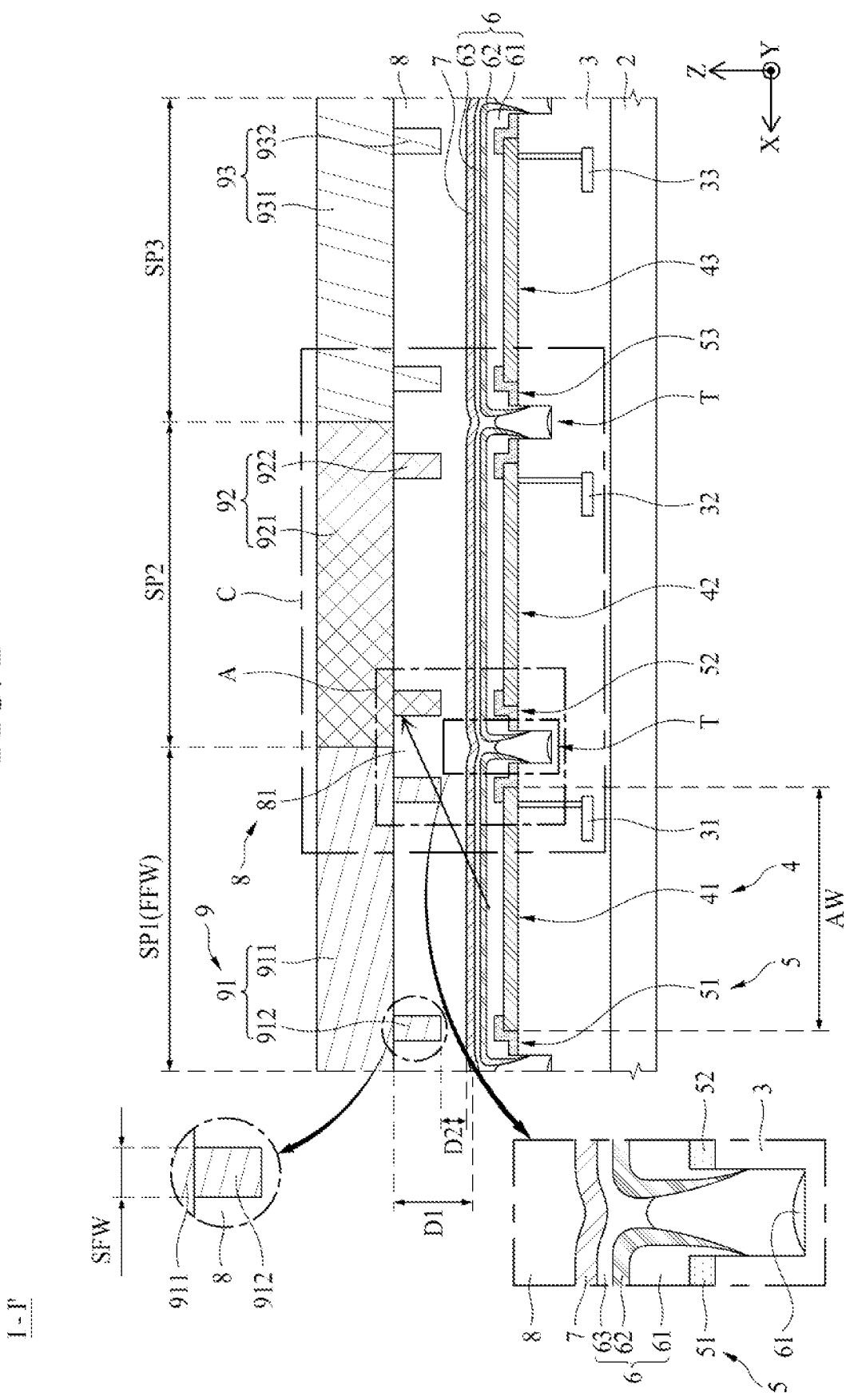
FIG. 2 is a schematic cross-sectional view illustrating line I-I' shown in FIG. 1.
Figure 3A:
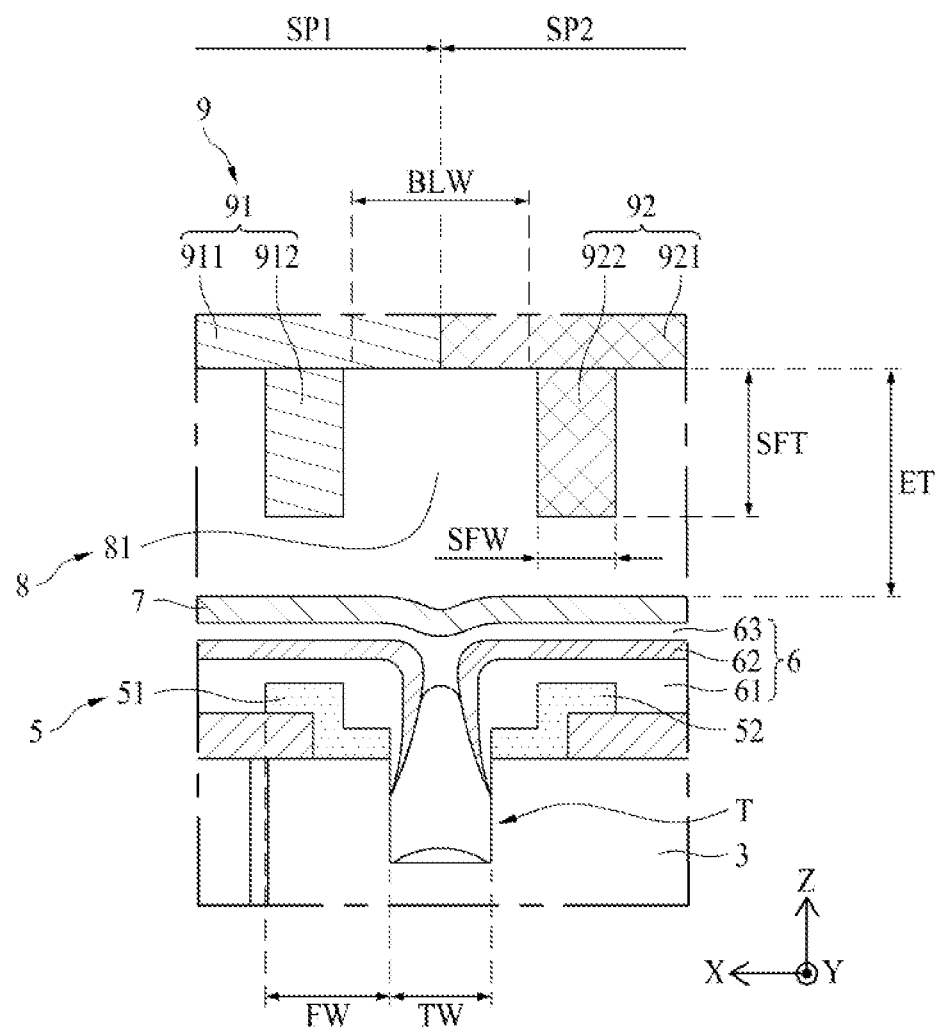
FIG. 3A is an enlarged view illustrating area A of FIG. 2.
Figure 3B:
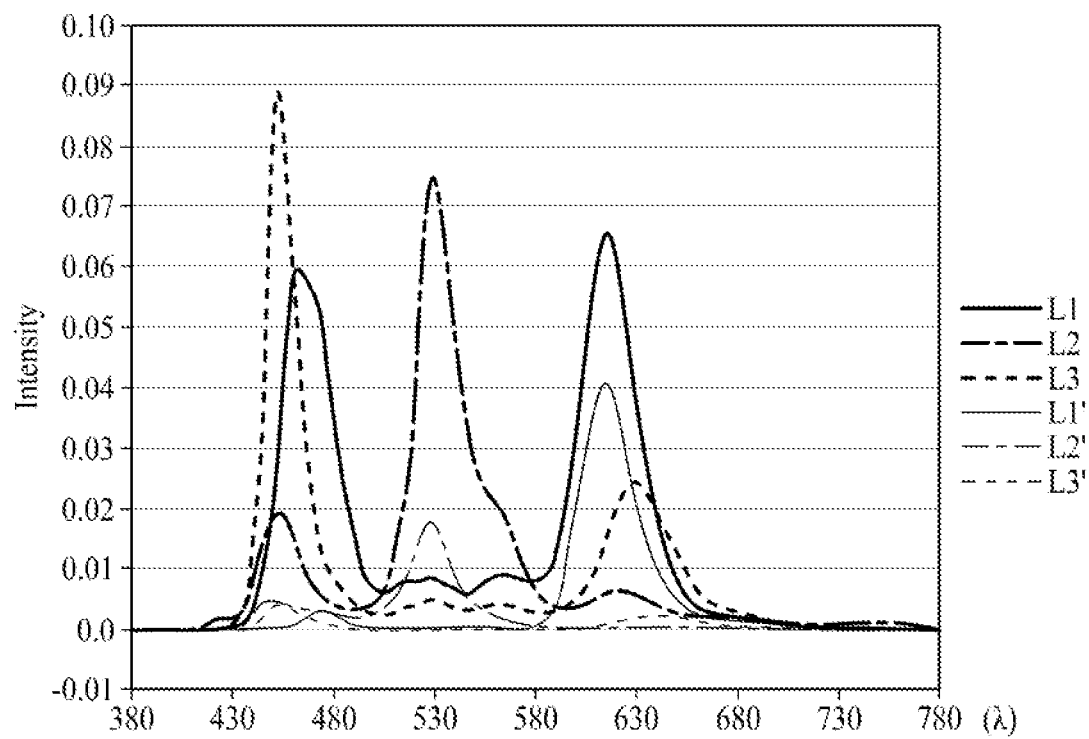
FIG. 3B is a schematic graph illustrating attenuation of a color mixture based on a width of a second filter of FIG. 3A.
Figure 3C:
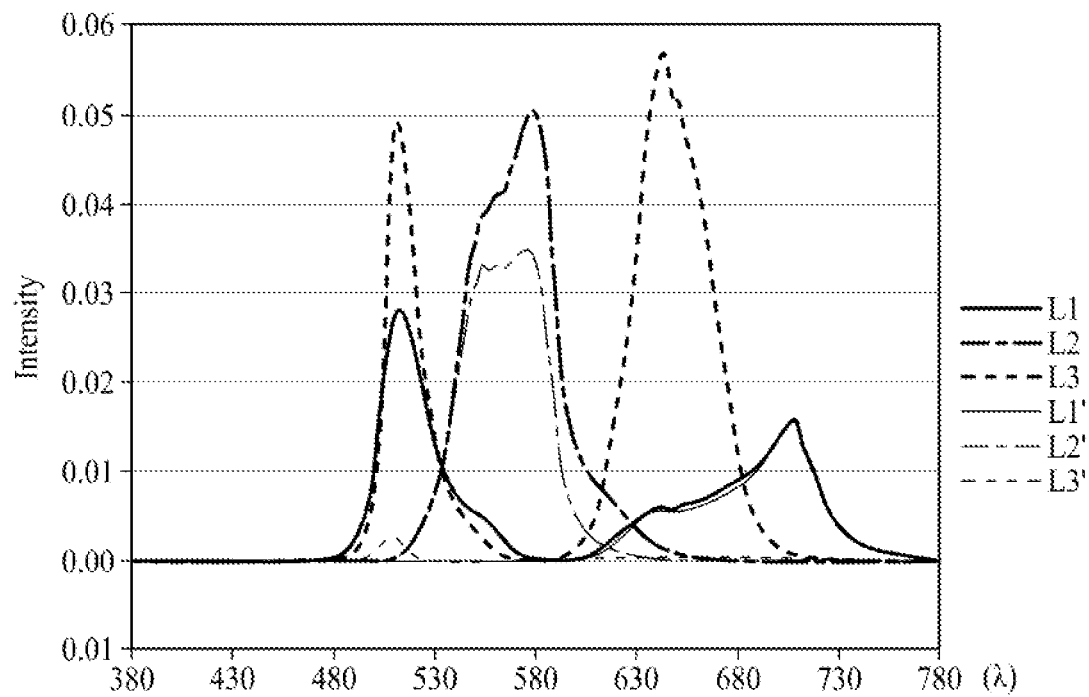
FIG. 3C is a schematic graph illustrating attenuation of luminance on a fence based on a thickness of a second filter of FIG. 3A.
Figure 4A:
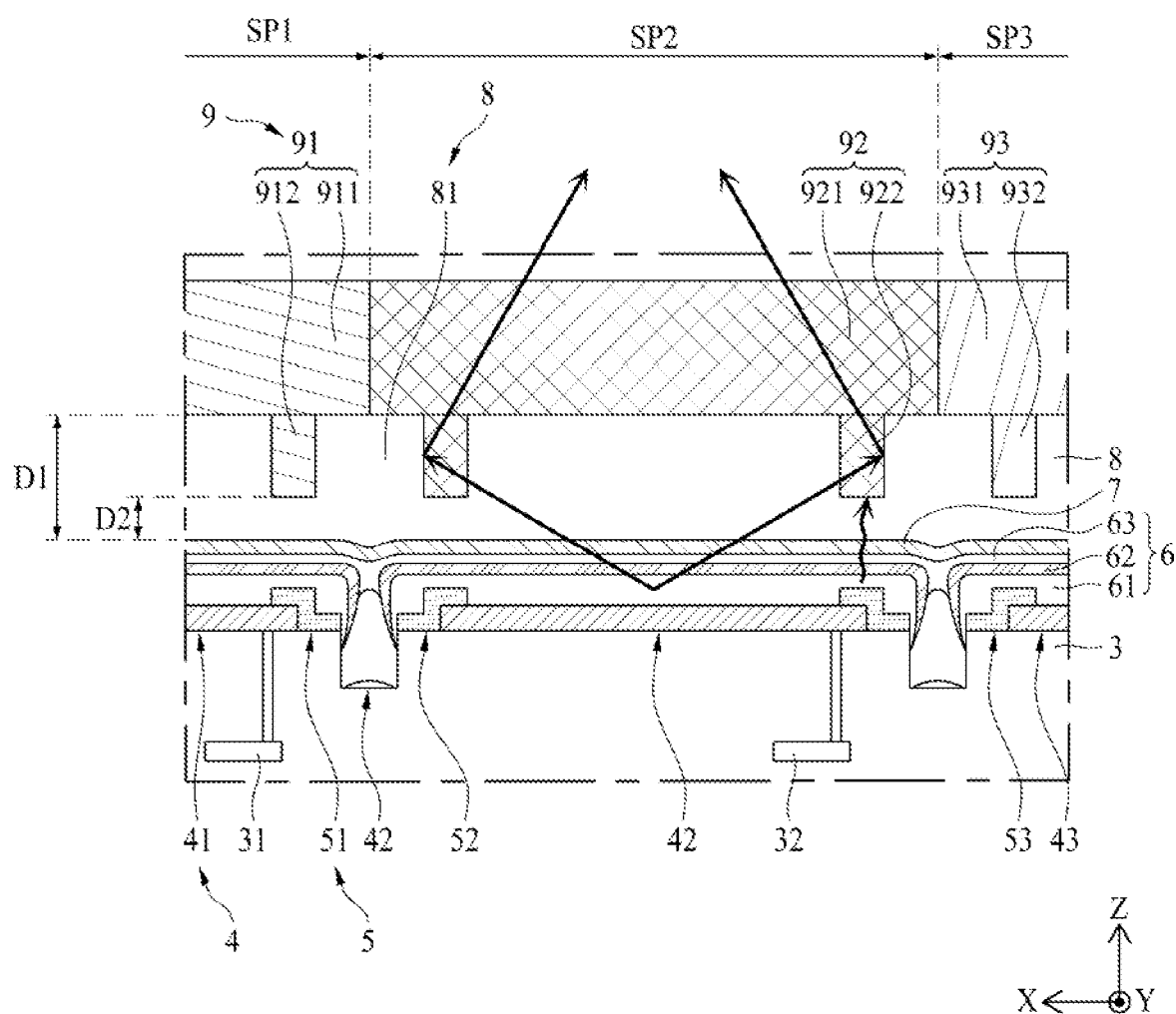
FIG. 4A is an enlarged view illustrating portion C of FIG. 2.
Figure 4B:
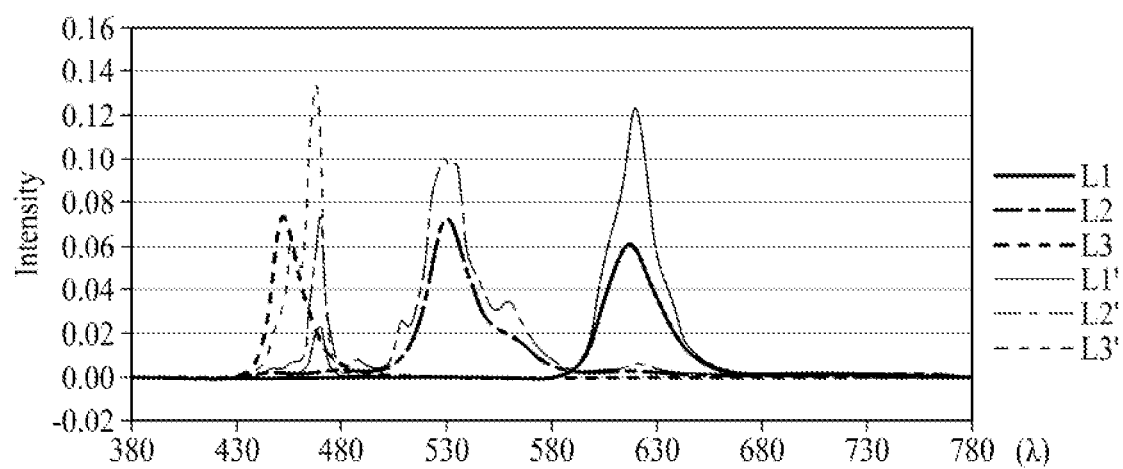
FIG. 4B is a schematic graph illustrating improvement of luminance based on a boundary layer of FIG. 4A.

FIG. 1 is a schematic plane view illustrating a display apparatus according to one aspect of the present disclosure, FIG. 2 is a schematic cross-sectional view illustrating line I-I' shown in FIG. 1, FIG. 3A is an enlarged view illustrating an area A of FIG. 2, FIG. 3B is a schematic graph illustrating attenuation of a color mixture based on a width of a second filter of FIG. 3A, FIG. 3C is a schematic graph illustrating attenuation of luminance on a fence based on a thickness of a second filter of FIG. 3A, FIG. 4A is an enlarged view illustrating a portion C of FIG. 2, and FIG. 4B is a schematic graph illustrating improvement of luminance based on a boundary layer of FIG. 4A.

Referring to FIGS. 1 to 4B, a display apparatus 1 according to one aspect of the present disclosure includes a substrate 2, a first electrode 4, a fence 5, a trench T, a light emitting layer 6, a second electrode 7 on the light emitting layer 6, and a color filter 9 on the second electrode 7.

The color filter 9 may include a first filter 911 spaced apart from the second electrode 7 at a first distance D1, and a second filter 912 spaced apart from the second electrode 7 at a second distance D2 that is shorter than the first distance D1. The second filter 912 may be disposed on a lower surface of the first filter 911. As the second filter 912 is disposed on the lower surface of the first filter 911, the second filter 912 may fully overlap the first filter 911 in a thickness direction of the substrate 2. The second filter 912 may be disposed to surround an edge of the first filter 911. Therefore, the second filter 912 may be positioned to be closer to the emissive layer 6 than the first filter 911.

A plurality of subpixels may be formed on the substrate 2.

The plurality of subpixels may include a first subpixel SP1, a second subpixel SP2 and a third subpixel SP3. The first subpixel SP1, the second subpixel SP2 and the third subpixel SP3 may constitute one pixel. The first subpixel SP1, the second subpixel SP2 and the third subpixel SP3 are sequentially arranged, so that the second subpixel SP2 may be disposed to be adjacent to one side of the first subpixel SP1, for example, a right side of the first subpixel SP1, and the third subpixel SP3 may be disposed to be adjacent to one side of the second subpixel SP2, for example, a right side of the second subpixel SP2. In the present disclosure, the case that two subpixels are disposed to be adjacent to each other may be interpreted that another subpixel is not disposed between the two subpixels.

The first to third subpixels SP1, SP2 and SP3 may be provided to have the same size. For example, the first to third subpixels SP1, SP2 and SP3 may be provided to have the same width and the same length. In this case, the width may refer to a horizontal direction (or first axial direction) X based on FIG. 1, and the length may refer to a vertical direction (or second axial direction) Y perpendicular to the width based on FIG. 1, but they are not limited thereto. The thickness direction (or third axial direction) Z may be in a direction perpendicular to each of the first axial direction X and the second axial direction Y.

Each of a boundary surface between the first subpixel SP1 and the second subpixel SP2 and a boundary surface between the second subpixel SP2 and the third subpixel SP3 may be positioned at a half of a width of a trench T. Therefore, each of the subpixels SP1, SP2 and SP3 may be disposed symmetrically on both sides based on the half of the trench T.

The first subpixel SP1 may be provided to emit red (R) light, the second subpixel SP2 may be provided to emit green (G) light and the third subpixel SP3 may be provided to emit blue (B) light, but they are not limited thereto.

The first electrode 4 is formed to be patterned for each of the subpixels SP1, SP2 and SP3. That is, one first electrode 41 is formed in the first subpixel SP1, another first electrode 42 is formed in the second subpixel SP2, and other first electrode 43 is formed in the third subpixel SP3. The first electrode 4 may serve as a positive electrode (or anode) of the display apparatus of the present disclosure.

The fence 5 is formed to surround an edge of the first electrode 4. An exposed area of the first electrode 4, which is exposed without being covered by the fence 5, constitutes a light emission area. Therefore, the light emission area is defined by the fence 5. The fence 5 may include a first fence 51 provided in the first subpixel SP1, a second fence 52 provided in the second subpixel SP2, and a third fence 53 provided in the third subpixel SP3.

The trench T may be formed among the plurality of subpixels SP1, SP2 and SP3. The trench T serves to prevent a leakage current from occurring between the adjacent subpixels SP1, SP2 and SP3. When intervals among the subpixels SP1, SP2 and SP3 is densely configured to implement high resolution, and when light is emitted from the light emitting layer in any one of the subpixels SP1, SP2 and SP3, charges in the light emitting layer move to another light emitting layer in another adjacent subpixel SP1, SP2 or SP3, whereby the leakage current may occur. Therefore, in one aspect of the present disclosure, the trench T is formed among the subpixels SP1, SP2 and SP3 so that a portion of the light emitting layer formed in the trench T is disconnected, whereby the leakage current may be prevented from occurring between the adjacent subpixels SP1, SP2 and SP3. However, even in this case, since the light emitting layer is formed until the light emitting layer is completely disconnected among the subpixels SP1, SP2 and SP3, the leakage current may occur up to the portion where the light emitting layer is continuously formed.

The light emitting layer 6 is formed on the first electrode 4 and the fence 5. The light emitting layer 6 according to one example may be provided to emit white (W) light. To this end, the light emitting layer 6 may include a plurality of stacks that emit light of different colors. In detail, the light emitting layer 6 may include a first stack 61, a second stack 63 and a charge generation layer (CGL) 62 provided between the first stack 61 and the second stack 63.

The light emitting layer 6 may be formed inside the trench T and above the trench T. According to one aspect of the present disclosure, since at least a portion of the light emitting layer 6 is formed inside the trench T, a current path between adjacent subpixels SP1, SP2 and SP3 is formed to be long and thus resistance is increased, whereby occurrence of the leakage current may be reduced. At least a portion of the light emitting layer 6 is formed above the trench T, so that the second electrode 7 formed on the light emitting layer 6 may not be disconnected among the first to third subpixels SP1, SP2 and SP3. In detail, the first stack 61 and the charge generation layer 62 of the light emitting layer 6 may be disconnected without being continuous within the trench T.

On the other hand, at least a portion of the second stack 63 of the light emitting layer 6 may be continuous over the trench T.

The color filter 9 is provided in each of the first to third subpixels SP1, SP2 and SP3 to block a specific color in light emitted from the light emitting layer of each subpixel. For example, the first color filter 91 provided in the first subpixel SP1 may be provided to block light of the remaining colors other than red (R) light. In this case, the first color filter 91 may be provided as a red color filter. The second color filter 92 provided in the second subpixel SP2 may be provided to block light of the remaining colors other than green (G) light. In this case, the second color filter 92 may be provided as a green color filter. The third color filter 93 provided in the third subpixel SP3 may be provided to block light of the remaining colors other than blue (B) light. In this case, the third color filter 93 may be provided as a blue color filter.

The first to third color filters 91, 92 and 93 respectively provided in the first to third subpixels SP1, SP2 and SP3 may have the same size as that of each subpixel, or may be reduced or enlarged at a predetermined ratio with respect to the size of each subpixel. The display apparatus 1 according to one aspect of the present disclosure will be described based on that the color filter is provided to have the same size as that of each subpixel.

In case of a general display apparatus, a black matrix is formed at a boundary portion of subpixels in order to avoid a color mixture between adjacent subpixels, but it is difficult to form the black matrix at an exact position because a pixel interval becomes narrow toward high resolution. In particular, in case of a head mounted display device having a dense pixel interval with high resolution, it is difficult to form the black matrix. When the black matrix is aligned to be inclined toward any one of the subpixels without being exactly aligned at the boundary portion of each subpixel, problems occur in that light emitting efficiency of the corresponding subpixel is lowered and a color mixture is generated.

In order to solve these problems, in the display apparatus 1 according to one aspect of the present disclosure, the color filter 9 of each subpixel transmitting light of only a specific color is provided to include a first filter 911 spaced apart from the second electrode 7 at a first distance D1, and a second filter 912 spaced apart from the second electrode 7 at a second distance D2 shorter than the first distance D1, whereby the problem of a color mixture may be solved without the black matrix. This will be described in detail with reference to the accompanying drawings.

Referring to FIGS. 1 to 4B, the display apparatus 1 according to one aspect of the present disclosure includes a substrate 2, an insulating layer 3, a first electrode 4, a fence 5, a trench T, a light emitting layer 6, a second electrode 7 on the light emitting layer 6, an encapsulation layer 8 on the second electrode 7 and a color filter 9 on the encapsulation layer 8.

The color filter 9 according to one example may include a first color filter 91, a second color filter 92 and a third color filter 93. The first color filter 91 may include a first filter 911 and a second filter 912 disposed on a lower surface of the first filter 911. The second color filter 92 may include a first filter 921 and a second filter 922 disposed on a lower surface of the first filter 921. The third color filter 93 may include a first filter 931 and a second filter 932 disposed on a lower surface of the first filter 931.

The second filters 912, 922 and 932 are disposed to be closer to the light emitting layer 6 than the first filters 911, 921 and 931, whereby a color mixture between adjacent subpixels may be avoided. The first filter 911, 921 and 931 and the second filter 912, 922 and 932 according to one example may be provided such that the encapsulation layer 8 having a flat upper surface is formed on the second electrode 7 and then the encapsulation layer 8 disposed on the non-light emission area (or fence) is removed through exposure and etching processes to form a color filter corresponding to the corresponding subpixel. After a portion of the encapsulation layer 8 is removed, since the color filter is formed in the area from which the encapsulation layer 8 is partially removed, the color filter may be formed to be self-aligned, whereby the color filter may be easily manufactured.

The substrate 2 may be a plastic film, a glass substrate or a semiconductor substrate such as silicon.

The substrate 2 may be made of a transparent material, or may be made of an opaque material. The first subpixel SP1, the second subpixel SP2 and the third subpixel SP3 are provided on the substrate 2. The first subpixel SP1 may be provided to transmit red (R) light, the second subpixel SP2 may be provided to transmit green (G) light, and the third subpixel SP3 may be provided to transmit blue (B) light.

The display apparatus 1 according to one aspect of the present disclosure is provided in a top emission type in which light is emitted toward an upper portion, and thus the substrate 2 may be made of an opaque material as well as a transparent material. The color filters 91, 92 and 93 may be provided on the upper portions of the subpixels SP1, SP2 and SP3 to transmit light of the above colors.

The insulating layer 3 may be provided on the substrate 2.

A circuit element that includes a plurality of thin film transistors 31, 32 and 33, various signal lines and a capacitor is provided for each of the subpixels SP1, SP2 and SP3 in the insulating layer 3. The signal lines may include a gate line, a data line, a power line and a reference line, and the thin film transistors 31, 32 and 33 may include a switching thin film transistor, a driving thin film transistor and a sensing thin film transistor. Each of the subpixels SP1, SP2 and SP3 is defined by an intersection structure of gate lines and data lines.

The switching thin film transistor is switched in accordance with a gate signal supplied to the gate line to supply a data voltage supplied from the data line to the driving thin film transistor.

The driving thin film transistor is switched in accordance with the data voltage supplied from the switching thin film transistor to generate a data current from a power source supplied from the power line and supply the data current to the first electrode 4.

The sensing thin film transistor may serve to sense a threshold voltage deviation of the driving thin film transistor, which causes degradation of image quality. The sensing thin film transistor supplies the current of the driving thin film transistor to the reference line in response to a sensing control signal supplied from the gate line or a separate sensing line.

The capacitor may serve to maintain the data voltage supplied to the driving thin film transistor for one frame, and is connected to a gate terminal and a source terminal of the driving thin film transistor, respectively.

The first thin film transistor 31, the second thin film transistor 32 and the third thin film transistor 33 are disposed for each of the subpixels SP1, SP2 and SP3 in the insulating layer 3. The first thin film transistor 31 according to one example may be connected to the first electrode 41 disposed on the first subpixel SP1 to apply a driving voltage for emitting light of a corresponding color to the first subpixel SP1.

The second thin film transistor 32 according to one example may be connected to the first electrode 42 disposed on the second subpixel SP2 to apply a driving voltage for emitting light of a corresponding color to the second subpixel SP2.

The third thin film transistor 33 according to one example may be connected to the first electrode 43 disposed on the third subpixel SP3 to apply a driving voltage for emitting light of a corresponding color to the third subpixel SP3.

Each of the first subpixel SP1, the second subpixel SP2 and the third subpixel SP3 according to one example supplies a predetermined current to the light emitting layer in accordance with the data voltage of the data line when the gate signal is input from the gate line using the respective thin film transistors 31, 32 and 33. Therefore, the light emitting layer of each of the first subpixel SP1, the second subpixel SP2 and the third subpixel SP3 may emit light with predetermined brightness in accordance with a predetermined current.

The insulating layer 3 may serve to planarize the upper surface of the substrate 2 while protecting the plurality of thin film transistors 31, 32 and 33. The insulating layer 3 may be made of an organic insulator, but is not limited thereto, and may be made of an inorganic insulator.

The insulating layer 3 is provided with a trench T having a concave structure. The trench T may be formed in the insulating layer 3. The trench T according to one example may be formed between the first subpixel SP1 and the second subpixel SP2 and between the second subpixel SP2 and the third subpixel SP3. The trench T may be disposed at boundary portions among the first to third subpixels SP1, SP2 and SP3 to disconnect a portion of the light emitting layer 6 as shown in FIG. 2. Therefore, the driving voltage of the subpixel that emits light may be prevented from leaking toward the adjacent subpixels.

The first electrode 4 is formed to be patterned on the insulating layer 3 for each of the subpixels SP1, SP2 and SP3. The first electrode 4 may be connected to the driving thin film transistor provided in the insulating layer 3. In detail, the first electrode 4 is connected to a source terminal or a drain terminal of the driving thin film transistor. To this end, a contact hole for exposing the source terminal or the drain terminal of the driving thin film transistor is formed in the insulating layer 3, and the first electrode 4 may be connected to the source terminal or the drain terminal of the driving thin film transistor through the contact hole.

The display apparatus 1 according to one aspect of the present disclosure is provided in a top emission type, and to this end, the first electrode 4 may be provided to reflect light emitted from the light emitting layer 6 toward the upper portion. In this case, the first electrode 4 may be provided in a double structure of a reflective layer for reflecting light and a transparent conductive layer for supplying holes to the light emitting layer 6.

The fence 5 is formed on the insulating layer 3 to surround and cover the edge of the first electrode 4. Therefore, as shown in the cross-sectional view of FIG. 2, the fence 5 may cover both ends of the first electrode 4 provided in each of the subpixels SP1, SP2 and SP3. In detail, the fence 5 is formed to cover a portion of an upper surface and sides of the first electrode 4 at both ends of the first electrode 4 and a portion of the insulating layer 3, whereby light emitting efficiency may be prevented from being deteriorated due to the current concentrated on the end of the first electrode 4. A portion of the upper surface of the first electrode 4, which is exposed without being covered by the fence 5, becomes a light emission area. The fence 5 may be provided to cover only a portion of the upper surface and the sides of the first electrode 4 at both ends of the first electrode 4. The fence 5 may be made of an inorganic insulating layer, but is not limited thereto.

The fence 5 may include a first fence 51 covering both ends of the first electrode 41 of the first subpixel SP1, a second fence 52 covering both ends of the first electrode 42 of the second subpixel SP2, and a third fence 53 covering both ends of the first electrode 43 of the third subpixel SP3.

The first fence 51, the second fence 52 and the third fence 53 may be provided to be in contact with the trench T, respectively. After the fence 5 is formed in the entire area among the subpixels SP1, SP2 and SP3, the fence 5 and a predetermined area of the insulating layer 3 below the fence 5 are removed between the first subpixel SP1 and the second subpixel SP2 and between the second subpixel SP2 and the third subpixel SP3 to form the trench T, whereby the fence 5 may be in contact with the trench T. That is, the trench T is formed in the fence 5 and the insulating layer 3 below the fence 5. Therefore, the display apparatus 1 according to one aspect of the present disclosure may shorten the manufacturing process time of the completed display apparatus as compared with the case that the fence 5 is formed to be patterned for each of the subpixels SP1, SP2 and SP3.

The light emitting layer 6 is formed on the first electrode 4 and the fence 5. The light emitting layer 6 may be also formed on the insulating layer 3 provided with the trench T. Therefore, the light emitting layer 6 may be disposed between the plurality of subpixels SP1, SP2 and SP3.

The light emitting layer 6 may be provided to emit white (W) light. To this end, the light emitting layer 6 may include a plurality of stacks that emit light of different colors. The light emitting layer 6 according to one example may include a first stack 61 for emitting blue light, a second stack 63 for emitting yellow-green light and a charge generation layer (CGL) 62 provided between the first stack 61 and the second stack 63.

In more detail, the first stack 61 may be provided on the first electrode 4, and may have a structure in which a hole injecting layer, a hole transporting layer, a blue light emitting layer EML(B) and an electron transporting layer are sequentially stacked.

The first stack 61 may be disconnected between the first subpixel SP1 and the second subpixel SP2 and between the second subpixel SP2 and the third subpixel SP3, that is, in the area of the trench T. Therefore, a portion of the first stack 61 that is disconnected may be disposed on the bottom of the trench T.

The charge generation layer 62 serves to supply charges to the first stack 61 and the second stack 63. The charge generation layer (CGL) 62 may include an N-type charge generation layer for supplying electrons to the first stack 61 and a P-type charge generation layer for supplying holes to the second stack 63. The N-type charge generation layer may include a metal material as a dopant.

The charge generation layer 62 is disconnected between the first subpixel SP1 and the second subpixel SP2 and between the second subpixel SP2 and the third subpixel SP3, that is, in the area of the trench T, but is provided until it is completely disconnected.

The second stack 63 may be provided on the charge generation layer 62, and may have a structure in which a hole transporting layer HTL, a yellow-green (YG) light emitting layer EML(YG), an electron transporting layer ETL and an electron injecting layer EIL are sequentially stacked.

The second stack 63 is connected between the first subpixel SP1 and the second subpixel SP2 and between the second subpixel SP2 and the third subpixel SP3. Therefore, the second electrode 7 provided on the second stack 63 may be connected to one without being disconnected even on the trench T.

The light emitting layer 6 is formed inside the trench T and above the trench T. According to one aspect of the present disclosure, since the light emitting layer 6 is formed inside the trench T, a current path between adjacent subpixels SP1, SP2 and SP3 is formed to be long and thus resistance is increased, whereby occurrence of the leakage current may be reduced.

The light emitting layer 6 is formed above the trench T, so that the second electrode 7 formed on the light emitting layer 6 may connected among the first to third subpixels SP1, SP2 and SP3 without disconnection. Therefore, the second electrode 7 may serve as a common electrode for applying a common voltage to the first to third subpixels SP1, SP2 and SP3.

Meanwhile, since the charge generation layer 62 is disconnected between the respective subpixels SP1, SP2 and SP3 disposed to be adjacent to each other with the trench T interposed therebetween, the charges cannot move through the charge generation layer 62. However, since a leakage current may flow along the charge generation layer 62 formed to reach the trench T, light emission may occur in the second stack 63 of the light emitting layer 6 disposed between the fence 5 and the second electrode 7 as shown in FIG. 4A. The display apparatus 1 according to one aspect of the present disclosure is provided such that the second filters 912, 922 and 932 overlap the fence 5, whereby the color filter may be provided to be relatively thicker on the fence 5 than the light emission area. This is because that only the first filters 911, 921 and 931 are disposed to overlap the light emission area in the light emission area, and the first filters 911, 921 and 931 and the second filters 912, 922 and 932 are disposed to overlap the fence 5 above the fence, that is, in the non-light emission area. Therefore, in the display apparatus 1 according to one aspect of the present disclosure, since transmittance of light emitted on the fence 5 due to the leakage current may be lowered, color purity of the subpixels emitting light may be improved. In another example, when the light emitted on the fence 5 due to the leakage current has a color different from that of the light emitted from the subpixel, the light may be primarily blocked by the second filters 912, 922 and 932, and may be secondarily blocked by the first filters 911, 921 and 931 on the second filters 912, 922 and 932, whereby color purity of the subpixels emitting light may be improved.

The second electrode 7 is formed on the light emitting layer 6. The second electrode 7 may serve as a cathode or a cathode electrode of the display apparatus 1 of the present disclosure. The second electrode 7 is formed in each of the subpixels SP1, SP2 and SP3 and between the subpixels in the same manner as the light emitting layer 6. That is, as shown in FIG. 2, the second electrode 7 may be connected to one in the first to third subpixels SP1, SP2 and SP3 without being disconnected on the trench T as shown in FIG. 2.

Since the display apparatus 1 according to one aspect of the present disclosure is provided in a top emission type, the second electrode 7 may include a transparent conductive material to transmit the light emitted from the light emitting layer 6 toward the upper portion. In addition, the second electrode 7 may be made of a semi-transparent electrode, whereby a micro cavity effect may be obtained for each of the subpixels SP1, SP2 and SP3. When the second electrode 7 is made of a semi-transparent electrode, reflection and re-reflection of the light may be repeated between the second electrode 7 and the first electrode 4 to obtain the micro cavity effect, whereby light efficiency may be improved.

The encapsulation layer 8 is formed on the second electrode 7 to prevent external moisture from being permeated into the light emitting layer 6. The encapsulation layer 8 may be made of an inorganic insulator or may be made of a structure in which an inorganic insulator and an organic insulator are alternately stacked, but is not limited thereto.

The color filter 9 is formed on the encapsulation layer 8. The color filter 9 according to one example may include a first color filter 91 of red (R) provided in the first subpixel SP1, a second color filter 92 of green (G) provided in the second subpixel SP2, and a third color filter 93 of blue (B) provided in the third subpixel SP3. The color filter 9 according to one example may be made of an organic mixture that includes a pigment capable of producing various colors. The color filter 9 according to another example may be formed by mixing an organic mixture containing a pigment with a photo initiator capable of being cured in UV. This color filter 9 may be expressed as terms such as a color photo resist.

For convenience, the first electrode 4, the first to third fences 51, 52 and 53, the light emitting layer 6, the second electrode 7, the encapsulation layer 8 and the color filter 9 in three subpixels SP1, SP2 and SP3 are schematically illustrated in FIG. 2.

As shown in FIG. 2, the first electrode 4, the fence 5, the light emitting layer 6, the second electrode 7, the encapsulation layer 8 and the color filter 9 are sequentially stacked.

The display apparatus 1 according to one aspect of the present disclosure may be implemented such that each of the first to third color filters 91, 92 and 93 includes a first filter and a second filter to prevent a color mixture between adjacent subpixels SP1, SP2 and SP3 without a black matrix. The second filter may be disposed to surround an edge of the first filter at a lower surface of the first filter. The second filter is arranged to surround an edge of the first filter on a lower surface of the first filter, so that some of the light emitted from each of the subpixels has no option but to be emitted to the adjacent subpixels through the second filter. Therefore, the second filter may be a primary barrier for preventing a color mixture with adjacent subpixels. In this case, as shown in FIG. 2, the edge of the first filter may refer to a position spaced apart from an end of the first filter at a predetermined distance. Therefore, the second filter may not be adjacent to the end of the first filter, but is not limited thereto. A portion of the second filter may be adjacent to the end of the first filter.

Meanwhile, in the display apparatus 1 according to one aspect of the present disclosure, the first filters 911, 921 and 931 of the color filters, that is, the first color filter 91, the second color filter 92 and the third color filter 93, which are respectively provided in the plurality of subpixels SP1, SP2 and SP3, are provided to be wider than the first electrode 4. For example, as shown in FIG. 2, a width FFW of the first filter 911 may be wider than that of the first electrode 4 of the first subpixel SP1. This is to allow the light emitted from the first electrode 4, which is not covered by the fence 5, that is, the light emission area to be emitted by passing through the first filter 911. The second filters 912, 922 and 932 of the first color filter 91, the second color filter 92 and the third color filter 93 may be disposed on the lower surfaces of the first filters 911, 921 and 931, and may be provided to be narrower than the first filters 911, 921 and 931. For example, as shown in FIG. 2, a width SFW of the second filter 912 may be narrower than the width FFW of the first filter 911 of the first subpixel SP1. This is to prevent a color mixture between adjacent subpixels without covering the light emission area. As shown in FIG. 2, the encapsulation layer 8 may be disposed to surround lower surfaces and sides of the second filters 912, 922 and 932. This is to improve front light condensing efficiency by using a difference in a refractive index between the second filters 912, 922 and 932 and the encapsulation layer 8. This will be described in detail with reference to FIGS. 4A and 5.

The first color filter 91 may include a first filter 911 and a second filter 912 disposed on a lower surface of the first filter 911. As shown in FIG. 2, the first filter 911 may be spaced apart from the second electrode 7 at a first distance D1. The second filter 912 may be spaced apart from the second electrode 7 at a second distance D2 shorter than the first distance D1. Therefore, the second filter 912 is disposed to be closer to the light emitting layer 6 than the first filter 911, so that a distance of a space in which the light emitted from the first subpixel SP1 may be emitted to the second subpixel SP2 adjacent thereto may be reduced. For example, the distance of the space in which the light emitted from the first subpixel SP1 may be emitted to the second subpixel SP2 adjacent thereto may be reduced from the first distance D1 having no second filter 912 to the second distance D2 having the second filter 912. Therefore, since the amount of light emitted from the first subpixel SP1 to the second subpixel SP2 without passing through the second filter 912 may be reduced, the second filter 912 may be a primary barrier capable of preventing a color mixture with the adjacent subpixels. In this case, the second filter 922 of the second subpixel SP2 adjacent to the first subpixel SP1 and the second filter of the third subpixel of another pixel adjacent to the first subpixel SP1 at another side are filters of colors different from that of the second filter 912 of the first subpixel SP1, and thus may be second barriers capable of preventing a color mixture.

The second color filter 92 according to one example may include a first filter 921 and a second filter 922 disposed on a lower surface of the first filter 921. As shown in FIG. 2, the first filter 921 may be spaced apart from the second electrode 7 at a first distance D1. The second filter 922 may be spaced apart from the second electrode 7 at a second distance D2 shorter than the first distance D1. Therefore, the second filter 922 is disposed to be closer to the light emitting layer 6 than the first filter 921, so that a distance of a space in which the light emitted from the second subpixel SP2 may be emitted to the first and third subpixels SP1 and SP3 adjacent thereto may be reduced. For example, the distance of the space in which the light emitted from the second subpixel SP2 may be emitted to the first and third subpixels SP1 and SP3 adjacent thereto may be reduced from the first distance D1 having no second filter 922 to the second distance D2 having the second filter 922. Therefore, since the amount of light emitted from the second subpixel SP2 to the first and third subpixels SP1 and SP3 without passing through the second filter 922 may be reduced, the second filter 922 may be a primary barrier capable of preventing a color mixture with the adjacent subpixels. In this case, the second filter 912 of the first subpixel SP1 adjacent to the second subpixel SP2 and the second filter 932 of the third subpixel SP3 adjacent to the second subpixel SP2 at another side are filters of colors different from that of the second filter 922 of the second subpixel SP2, and thus may be second barriers capable of preventing a color mixture.

The third color filter 93 according to one example may include a first filter 931 and a second filter 932 disposed on a lower surface of the first filter 931. As shown in FIG. 2, the first filter 931 may be spaced apart from the second electrode 7 at a first distance D1. The second filter 932 may be spaced apart from the second electrode 7 at a second distance D2 shorter than the first distance D1. Therefore, the second filter 932 is disposed to be closer to the light emitting layer 6 than the first filter 931, so that a distance of a space in which the light emitted from the third subpixel SP3 may be emitted to the second subpixel SP2 adjacent thereto may be reduced. For example, the distance of the space in which the light emitted from the third subpixel SP3 may be emitted to the second subpixel SP2 adjacent thereto may be reduced from the first distance D1 having no second filter 932 to the second distance D2 having the second filter 932. Therefore, since the amount of light emitted from the third subpixel SP3 to the second subpixel SP2 without passing through the second filter 932 may be reduced, the second filter 932 may be a primary barrier capable of preventing a color mixture with the adjacent subpixels. In this case, the second filter 922 of the second subpixel SP2 adjacent to the third subpixel SP3 and the second filter of the first subpixel of another pixel adjacent to the third subpixel SP3 at another side are filters of colors different from that of the second filter 932 of the third subpixel SP3, and thus may be second barriers capable of preventing a color mixture.

As a result, in the display apparatus 1 according to one aspect of the present disclosure, the second filters of different colors are disposed to be protruded toward the light emitting layer 6 at the boundary portion of the subpixels, so that a color mixture between adjacent subpixels may be avoided.

Referring to FIGS. 2 and 3, the second filter 922 and the fence 52 of the second subpixel SP2 and the second filter 932 and the fence 53 of the third subpixel SP3 may have the same function and effect as those of the second filter 912 and the fence 51 of the first subpixel SP1 except their positions. Therefore, the description will be based on features of the second filter 912 and the fence 51 of the first subpixel SP1, and features of the second filter 922 and the fence 52 of the second subpixel SP2 and the second filter 932 and the fence 53 of the third subpixel SP3 will be replaced with the description of the second filter 912 and the fence 51 of the first subpixel SP1.

At least a portion of the second filter 912 of the first subpixel SP1 may overlap the fence 51. When the second filter 912 overlaps the first electrode 41 which is not covered by the fence 51, that is, when the second filter 912 overlaps the light emission area, the color filter 91 becomes thicker to reduce light transmittance, so that luminance may be reduced. Therefore, the second filter 912 may be formed from the end of the fence 51, which does not cover the first electrode 41, to the boundary portion of the subpixels.

However, the display apparatus 1 according to one aspect of the present disclosure may be provided such that the encapsulation layer 8 includes a boundary layer 81 that overlaps the trench T between the second filters. Therefore, since a process margin for forming the boundary layer 81 should be secured, the second filter 912 may be provided so as not to overlap the trench T. As a result, in the display apparatus 1 according to one aspect of the present disclosure, the second filter 912 may be provided between the end of the fence 51, which overlaps the first electrode 41, and the trench T.

Figure 5:
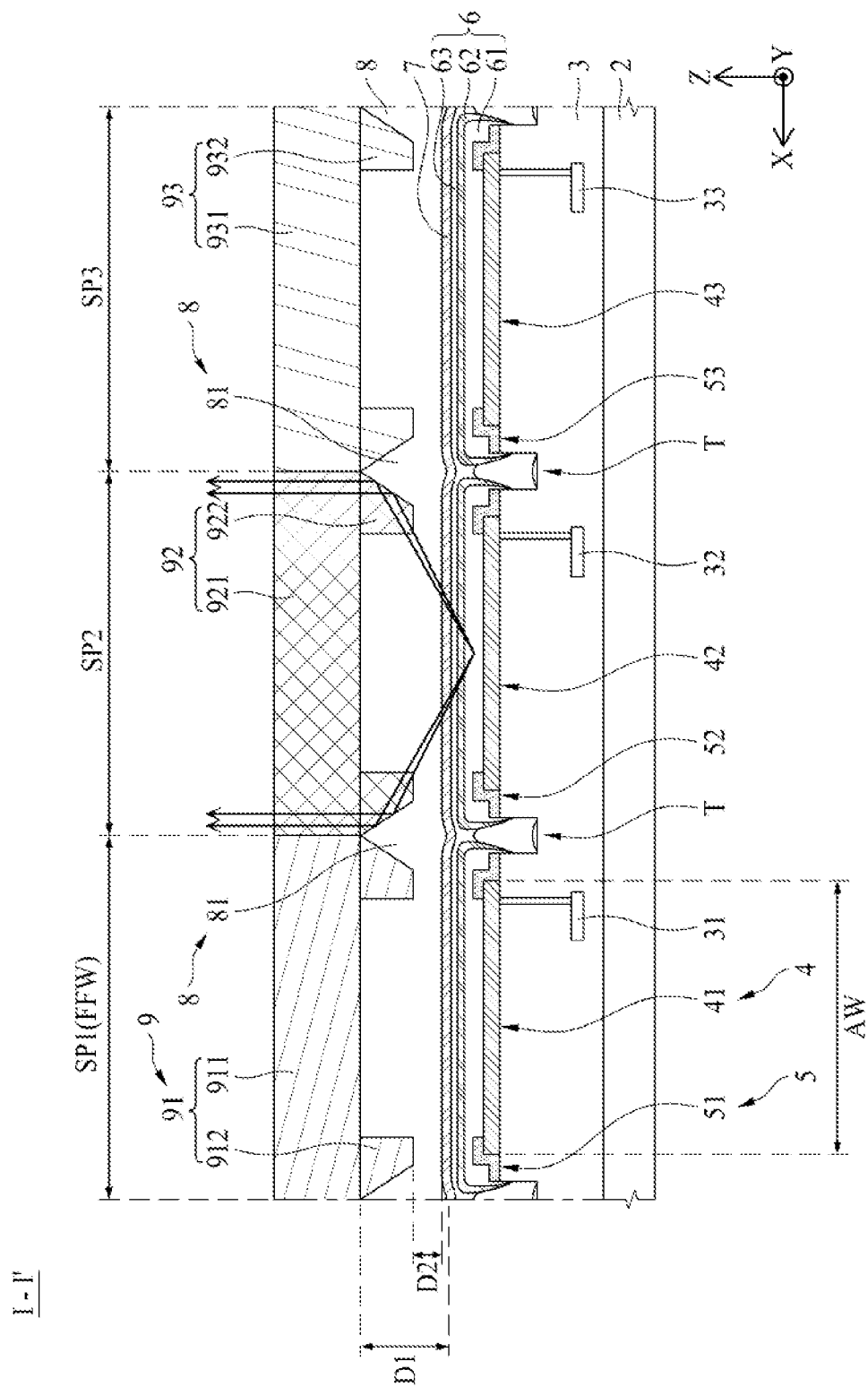
FIG. 5 is a schematic cross-sectional view illustrating a display apparatus according to another aspect of the present disclosure.

In the display apparatus 1 according to another aspect of the present disclosure, since the boundary layer 81 is formed in a triangular shape in which a width becomes narrower as the boundary layer 81 becomes far away from the trench T, a portion of the second filter 912 may overlap the trench T, and a portion of the second filter 912 overlapped with the trench T may not overlap the fence 5, as shown in FIG. 5. Therefore, the display apparatus 1 according to the present disclosure may have a structure in which at least a portion of the second filter 912 may be overlapped with the fence 51, whereby a color mixture between adjacent subpixels may be avoided without attenuation of luminance of the light emission area.

Referring to FIG. 3A, the width SFW of the second filter 912 may be smaller than a width FW of the fence 51. As the width SFW of the second filter 912 is wider, a color mixture to the adjacent subpixel may be reduced. However, as described above, the width SFW of the second filter 912 may be determined within the range that does not overlap the trench T to make sure of the process margin of the boundary layer 81. For example, the width SFW of the second filter 912 may be smaller than or equal to 45% of a width of the non-light emission area. In this case, the width of the non-light emission area may mean a sum of a width of the fence disposed at the boundary portion of the adjacent subpixels and a width of the trench disposed between the fences. When the width SFW of the second filter 912 exceeds 45% of the width of the non-light emission area, it may be difficult to form the boundary layer 81 on the trench T. When the width SFW of the second filter 912 exceeds 50% of the width of the non-light emission area, the second filter 912 may be positioned on the light emission area to reduce front luminance. Therefore, in the display apparatus 1 according to one aspect of the present disclosure, the width SFW of the second filter 912 may be smaller than or equal to 45% of the width of the non-light emission area. In more detail, the width SFW of the second filter 912 may be smaller than the width FW of the fence 51.

Meanwhile, the inventor who invented the display apparatus 1 according to one aspect of the present disclosure tested a color mixture attenuation rate when the width SFW of the second filter 912 is 0.3 um, 0.5 um and 0.7 um, wherein the color mixture attenuation rate is the highest when the width SFW of the second filter 912 is 0.7 um. FIG. 3B is a graph illustrating attenuation of a color mixture of each RGB color when the width SFW of the second filter 912 is 0.7 um.

Referring to FIG. 3B, a horizontal axis denotes a wavelength λ, and a vertical axis denotes intensity of light. L1, L2 and L3 are curves illustrating a color mixture of RGB on the assumption that a color mixture occurrence rate of adjacent subpixels is 100% in a structure in which there is no second filter like the present disclosure, and L1', L2' and L3' are curves illustrating a color mixture of RGB when the width SFW of the second filter 912 of the present disclosure is 0.7 um.

As shown in FIG. 3B, in case of red light, a ratio of a total area of the curve L1' to a total area of the curve L1 is about 31.2%. Therefore, in case of red light, the color mixture attenuation rate may be about 68.8%. In case of green light, a ratio of a total area of the curve L2' to a total area of the curve L2 is about 22.3%. Therefore, in case of green light, the color mixture attenuation rate may be about 77.7%. In case of blue light, a ratio of a total area of the curve L3' to a total area of the curve L3 is about 7.3%. Therefore, in case of blue light, the color mixture attenuation rate may be about 92.7%.

As a result, in the display apparatus 1 according to one aspect of the present disclosure, the width SFW of the second filter 912 is provided to be 0.7 um, so that a color mixture of each of red light, green light and blue light may be reduced by about 68.8%, about 77.7% and about 92.7% as compared with the case that there is no second filter.

Referring back to FIG. 3A, the thickness SFT of the second filter 912 may be smaller than a thickness ET of the encapsulation layer 8. In this case, the thickness ET of the encapsulation layer 8 may mean a distance from the lower surface of the first filter 911 to the upper surface of the second electrode 7. When the thickness SFT of the second filter 912 is equal to the thickness ET of the encapsulation layer 8, the color filter 9 is brought into contact with the second electrode 7, so that moisture may be permeated through the color filter 9, whereby the second electrode 7 and the light emitting layer 6 below the second electrode 7 may be damaged. Therefore, in order to prevent lifetime of the light emitting layer 6 from being deteriorated due to moisture permeation, the thickness SFT of the second filter 912 may be smaller than the thickness ET of the encapsulation layer 8. The thickness SFT of the second filter 912 according to one example may be 1.5 um or less. When the thickness SFT of the second filter 912 is greater than 1.5 um, an effect of a luminance attenuation of the light emitted from the non-light emission area is not great and only anti-moisture permeation characteristics may be deteriorated.

Meanwhile, as the thickness SFT of the second filter 912 becomes thicker, luminance of the non-light emission area in which the fence 51 is disposed may be reduced. This may lead to an effect in which a color reproduction rate of the subpixel that emits light may be improved. Referring to FIG. 4A, light may be emitted in the non-light emission area on the fence due to the leakage current. The inventor of the display apparatus 1 according to one aspect of the present disclosure tested a luminance attenuation rate based on light emission of the non-light emission area, that is, light emission of the light emitting layer on the fence 51 due to the leakage current when the thickness SFT of the second filter 912 is 0.5 um, 1.0 um and 1.5 um, wherein the luminance attenuation rate of the non-light emission area is the highest when the thickness SFT of the second filter 912 is 1.5 um. FIG. 3C is a graph illustrating luminance attenuation of each RGB when the thickness SFT of the second filter 912 is 1.5 um.

Referring to FIG. 3C, a horizontal axis denotes a wavelength λ, and a vertical axis denotes intensity of light. L1, L2 and L3 are curves illustrating luminance of RGB light emitted from the non-light emission area in a structure in which there is no second filter like the present disclosure, and L1', L2' and L3' are curves illustrating luminance of RGB light in the non-light emission area when the thickness SFT of the second filter 912 of the present disclosure is 1.5 um.

As shown in FIG. 3C, in case of red light, a ratio of a total area of the curve L1' to a total area of the curve L1 is about 47.7%. Therefore, in case of red light, the luminance attenuation rate may be about 52.3%. In case of green light, a ratio of a total area of the curve L2' to a total area of the curve L2 is about 69.3%. Therefore, in case of green light, the luminance attenuation rate may be about 30.7%. In case of blue light, a ratio of a total area ratio of the curve L3' to a total area of the curve L3 is about 1.4%. Therefore, in case of blue light, the luminance attenuation rate may be about 98.6%.

As a result, in the display apparatus 1 according to one aspect of the present disclosure, the thickness SFT of the second filter 912 is provided to be 1.5 um, so that luminance of each of red light, green light and blue light in the non-light emission area may be reduced by about 52.3%, about 30.7% and about 98.6% as compared with the case that there is no second filter. As luminance of light emitted from the non-light emission area is reduced, a color reproduction rate of a corresponding color may be relatively improved in the light emission area.

Referring to FIGS. 3A and 4A, the display apparatus 1 according to one aspect of the present disclosure may further include a boundary layer 81 disposed at each boundary portion among the plurality of subpixels SP1, SP2 and SP3. The boundary layer 81 may be a portion of the encapsulation layer 8.

The boundary layer 81 may be disposed at each boundary portion among the plurality of subpixels SP1, SP2 and SP3 so that the boundary layer 81 may be in contact with the second filters of the adjacent subpixels, for example, each of the second filter 912 of the first subpixel SP1 and the second filter 922 of the second subpixel SP2. The boundary layer 81 may be in contact with a side of each of the second filter 912 of the first subpixel SP1 and the second filter 922 of the second subpixel SP2. In detail, the boundary layer 81 may be in contact with one side of the second filter 912 of the first subpixel SP1, for example, one side facing the second filter 922 of the second subpixel SP2. Also, the boundary layer 81 may be in contact with one side of the second filter 922 of the second subpixel SP2, for example, one side facing the second filter 912 of the first subpixel SP1. The boundary layer 81 may be provided to have a refractive index smaller than a refractive index of the second filter 912 of the first subpixel SP1 and the second filter 922 of the second subpixel SP2. Since the boundary layer 81 is a portion of the encapsulation layer 8, for simplification of manufacture, the entire encapsulation layer 8 may be formed of a low refractive material having a refractive index lower than that of the second filter, but is not limited thereto. The boundary layer 81 may be made of a low refractive material having a refractive index lower than that of the second filter and the remaining encapsulation layer 8 except the boundary layer 81 may be provided to have a refractive index different from that of the boundary layer 81. As a result, the light incident on the second filter 912 after being emitted from the first subpixel SP1 may be reflected toward the first subpixel SP1 due to the difference in the refractive index between the second filter 912 and the boundary layer 81, whereby luminance of the first subpixel SP1 may be improved. Likewise, light incident on the second filter 922 after being emitted from the second subpixel SP2 may be reflected toward the second subpixel SP2 due to the difference in the refractive index between the second filter 922 and the boundary layer 81, whereby luminance of the second subpixel SP2 may be improved. Although not shown, the light incident on the second filter 932 after being emitted from the third subpixel SP3 may be reflected toward the third subpixel SP3 due to the difference in the refractive index between the second filter 932 and the boundary layer 81, whereby luminance of the third subpixel SP3 may be improved. In this case, reflection may be a concept including diffracted light. FIG. 4B is a graph illustrating improvement of luminance of each RGB when the thickness SFT of the second filter is 0.5 um.

Referring to FIG. 4B, a horizontal axis denotes a wavelength λ, and a vertical axis denotes intensity of light. L1, L2 and L3 are curves illustrating luminance of RGB light in a structure in which there is no second filter like the present disclosure, and L1', L2' and L3' are curves illustrating luminance of RGB light based on the difference in the refractive index between the second filter and the boundary layer 81 when the thickness SFT of the second filter 912 of the present disclosure is 0.5 um.

As shown in FIG. 4B, in case of red light, a ratio of a total area of the curve L1 to a total area of the graph L1' is about 32.4%. Therefore, in case of red light, a luminance improvement rate may be about 67.6%. In case of green light, a ratio of a total area of the curve L2 to a total area of the curve L2' is about 31.9%. Therefore, in case of green light, the luminance improvement rate may be about 68.1%. In case of blue light, a ratio of a total area of the curve L3 to a total area of the curve L3' is about 72.4%. Therefore, in case of blue light, the luminance improvement rate may be about 27.6%.

As a result, in the display apparatus 1 according to one aspect of the present disclosure, when the thickness SFT of the second filter is provided to be 0.5 um and the boundary layer 81 is provided at the boundary portion of the subpixels, luminance of each of red light, green light and blue light may be improved by about 67.6%, about 68.1% and about 27.6% as compared with the case that there is no second filter.

Meanwhile, the boundary layer 81 is disposed at each boundary portion among the plurality of subpixels SP1, SP2 and SP3, so that the boundary layer 81 may overlap the trench T. The boundary layer 81 may be provided to be wider than the trench T. As shown in FIG. 3A, a width BLW of the boundary layer 81 may be wider than a width TW of the trench T. When the width of the boundary layer is equal to or narrower than that of the trench, the width of the boundary layer is too thin, whereby it is difficult to form the boundary layer in the process. Even though the boundary layer is formed, it is difficult to exactly position the boundary layer at the boundary portion of the subpixels. In order to make sure of a process margin of the boundary layer 81, the width BLW of the boundary layer 81 may be wider than the width TW of the trench T.

In the display apparatus 1 according to one aspect of the present disclosure, the boundary layer 81 is disposed to overlap the trench T, and the second filters 912, 922 and 932 of the plurality of subpixels SP1, SP2 and SP3 are disposed to be spaced apart from each other with the boundary layer 81 interposed therebetween. Therefore, as shown in FIG. 2, since the light incident on the second filter of the corresponding subpixel after being emitted from the subpixel cannot pass through the second filter of another color of the adjacent subpixel, a color mixture between the adjacent subpixels may be avoided.

As a result, in the display apparatus 1 according to one aspect of the present disclosure, the second filters having different colors are disposed in the boundary portions of the subpixels so that a color mixture may be avoided, and the second filters are disposed to be closer to the light emitting layer than the first filter, so that the amount of light toward the adjacent subpixels may be reduced, whereby a color mixture prevention may be maximized.

FIG. 5 is a schematic cross-sectional view illustrating a display apparatus according to another aspect of the present disclosure.

Referring to FIG. 5, the display apparatus 1 according to another aspect of the present disclosure is the same as the display apparatus according to FIGS. 1 to 4B except that the second filters 912, 922, 932 and the boundary layer 81 of the subpixels SP1, SP2 and SP3 are modified. Therefore, the same reference numerals are given to the same elements, and the following description will be based on differences from FIGS. 1 to 4B.

In case of the display apparatus according to FIG. 1, the second filters 912, 922 and 932 are disposed so as not to overlap the trench T. Therefore, in the display apparatus of FIG. 1, the second filters 912, 922 and 932 may be formed in a rectangular shape, and light may be reflected on sides of the second filters 912, 922 and 932 provided in a rectangular shape in a direction opposite to a direction of the incident light, as shown in FIG. 4A, due to a difference in a refractive index between the second filters 912, 922 and 932 and the boundary layer 81. Therefore, in the display apparatus according to FIG. 1, a color mixture between adjacent subpixels may be avoided, and luminance of the subpixels that emit light may be improved.

In contrast, in the display apparatus according to FIG. 5, the second filters 912, 922 and 932 may be provided to be wider as the second filters 912, 922 and 932 become far away from the trench T. That is, the width of the boundary layer 81 may be provided to be narrower as the boundary layer 81 becomes far away from the trench T. This may be implemented by widening an etching area of the encapsulation layer 8 surrounding the boundary layer 81 in the process of forming the boundary layer 81. Therefore, the sides of the second filters 912, 922 and 932 adjacent to the boundary layer 81 may be provided in a diagonal shape, and the boundary layer 81 may be provided in a triangular shape. Therefore, as shown in FIG. 5, the light incident on the second filter after being emitted from the subpixel may be emitted to a front surface of the subpixel, which emits light, by being reflected on the boundary surface provided in a diagonal shape. As shown in FIG. 5, since the boundary surface of a diagonal shape, between the second filters 912, 922 and 932 and the boundary layer 81 adjacent to each other, is provided to be longer than that of the display apparatus of FIG. 1, the amount of light reflected to the front surface is increased, whereby luminance may be more improved. In addition, since the light reflected on the boundary surface of a diagonal shape may be emitted in the vertical direction (or the third axial direction Z), light condensing efficiency with respect to the front surface may be more improved than the display apparatus of FIG. 1 in which light is emitted in the direction opposite to the incident direction.

Figure 6:
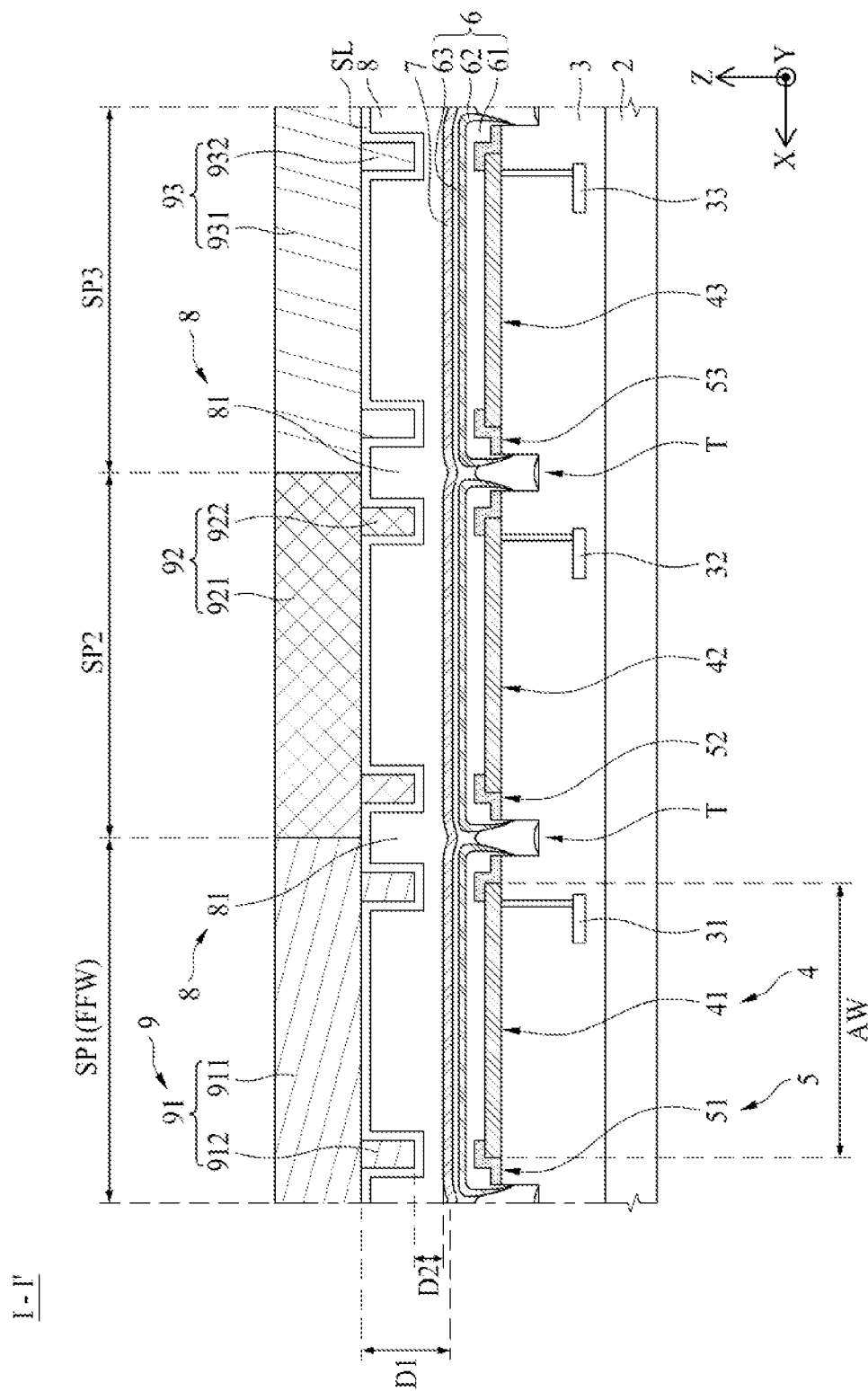
FIG. 6 is a schematic cross-sectional view illustrating a display apparatus according to other aspect of the present disclosure.

FIG. 6 is a schematic cross-sectional view illustrating a display apparatus according to other aspect of the present disclosure.

Referring to FIG. 6, the display apparatus 1 according to another aspect of the present disclosure is the same as the display apparatus according to FIGS. 1 to 4B except that a sub layer SL is further provided between the encapsulation layer 8 and the color filter 9. Therefore, the same reference numerals are given to the same elements, and the following description will be based on differences from FIGS. 1 to 4(B).

In case of the display apparatus according to FIG. 1, in order to avoid a color mixture between adjacent subpixels, the second filters 912, 922 and 932 are disposed to be closer to the light emitting layer 6 than the first filters 911, 921 and 931. Therefore, since the thickness of the encapsulation layer 8 is formed as much as the second distance D2 in the position where the second filters 912, 922 and 932 are disposed, the thickness of the encapsulation layer 8 is relatively thinner than the encapsulation layer 8 that is in contact with the first filters 911, 921 and 931. Therefore, in case of the display apparatus according to FIG. 1, a color mixture may be avoided by the second filters 912, 922 and 932, but anti-moisture permeation of the light emitting layer 6 may be relatively lowered in the place where the second filters 912, 922 and 932 are disposed.

In contrast, in case of the display apparatus according to FIG. 6, the sub layer SL is further provided between the encapsulation layer 8 and the color filter 9, whereby anti-moisture permeation to the light emitting layer 6 may be improved. The sub layer SL may be made of an anti-moisture permeation material such as $Al_2O_3$, and is disposed to cover the lower surface of the first filters 911, 921 and 931 and the lower surface and sides of the second filters 912, 922 and 932 as shown in FIG. 6, so that anti-moisture permeation to the light emitting layer 6 may be improved. In addition, since the sub layer SL is formed by an ALD process having good step coverage characteristics, the sub layer SL may be provided to cover at least one of the encapsulation layer 8 or the color filter 9 without being disconnected between the encapsulation layer 8 and the color filter 9. Therefore, in the display apparatus 1 according to another aspect of the present disclosure, anti-moisture permeation to the light emitting layer 6 may be improved due to the sub layer SL provided between the encapsulation layer 8 and the color filter 9.

Figure 7A:
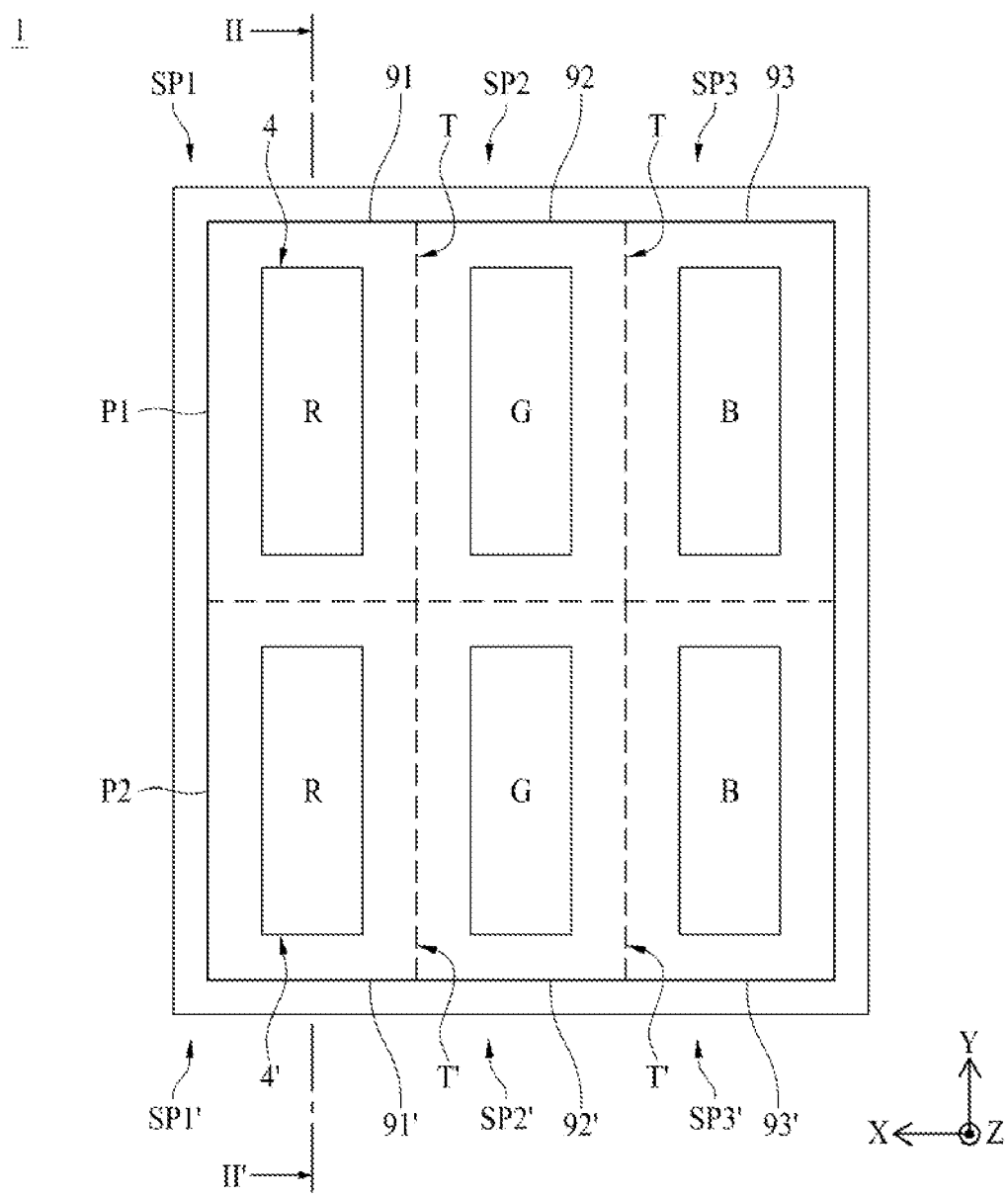
FIG. 7A is a plan view illustrating an example of a plurality of pixels of a display apparatus according to one aspect of the present disclosure.
Figure 7B:
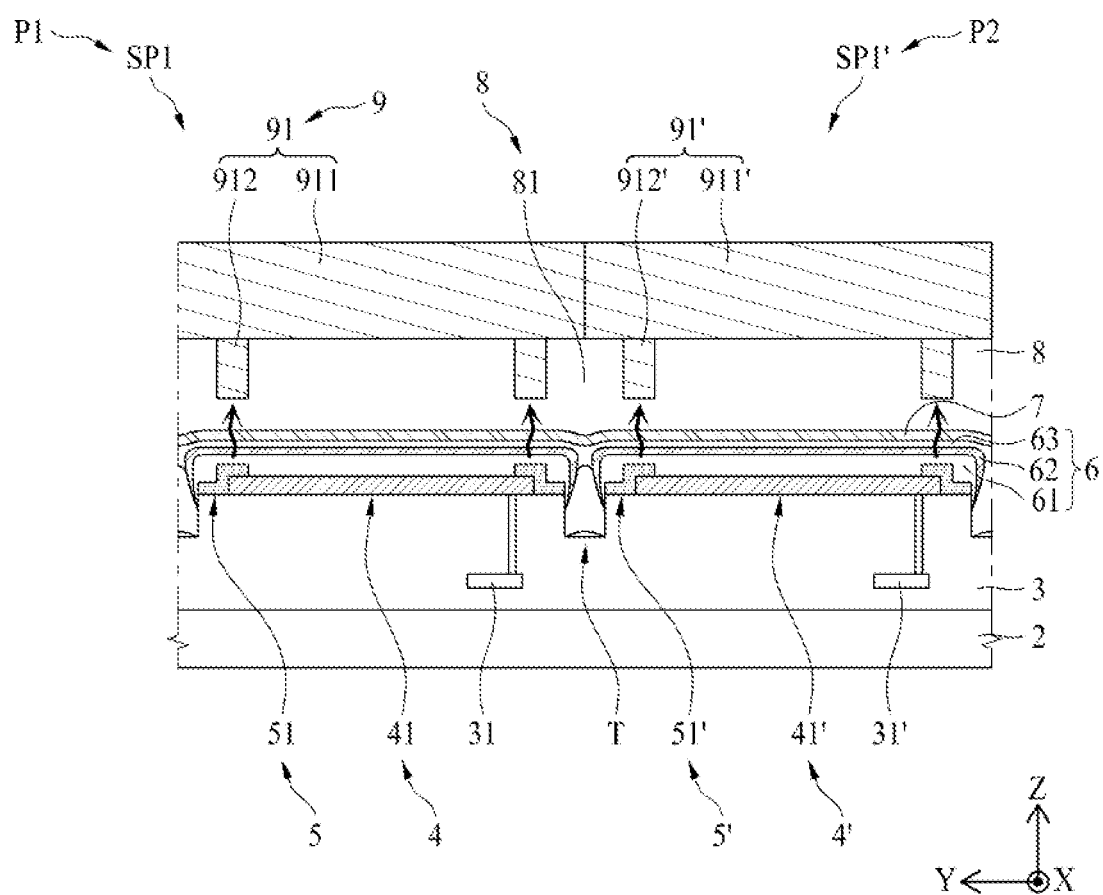
FIG. 7B is a schematic cross-sectional view illustrating line II-II shown in FIG. 7A.

FIG. 7A is a plan view illustrating an example of a plurality of pixels of a display apparatus according to one aspect of the present disclosure, and FIG. 7B is a schematic cross-sectional view illustrating line II-II' shown FIG. 7A.

Referring to FIGS. 7A and 7B, in the display apparatus 1 according to one aspect of the present disclosure, a first subpixel SP1 provided to emit red light, a second subpixel SP2 provided to emit green light and a third subpixel SP3 provided to emit blue light may be disposed in the first axial direction X, and a first subpixel SP1', a second subpixel SP2' and a third subpixel SP3' emitting light of the same color may be disposed in the second axial direction Y, respectively. That is, the first pixel P1 including the first subpixel SP1, the second subpixel SP2 and the third subpixel SP3 and the second pixel P2 including the first subpixel SP1', the second subpixel SP2' and the third subpixel SP3', which emit light of the same color as that of each of the first subpixel SP1, the second subpixel SP2 and the third subpixel SP3 of the first pixel P1, may be provided to be disposed in a stripe shape in a line in the second axial direction Y, but are not limited thereto. The second pixel P2 may be disposed in the order of the second subpixel SP2', the first subpixel SP1' and the third subpixel SP3' in the first axial direction X, so that the second pixel P2 may be provided in a structure not a stripe shape with the first pixel P1.

As shown in FIG. 7A, in the display apparatus 1 according to one aspect of the present disclosure, even in the case that the first pixel P1 and the second pixel P2 are disposed in a stripe shape, each of the subpixels adjacent to each other in the second axial direction Y may include a second filter. This is to enhance color purity of the subpixels even though the subpixels emitting light of the same color are disposed to be adjacent to each other.

For example, as shown in FIG. 7B, the first color filter 91 of the first subpixel SP1 of the first pixel P1 may include the first filter 911 and the second filter 912. A first color filter 91' of the first subpixel SP1' of the second pixel P2 may include a first filter 911' and a second filter 912'. For convenience of description, it is assumed that the first subpixel SP1' of the second pixel P2 is a second subpixel adjacent to the first subpixel SP1 of the first pixel P1 in the second axial direction Y.

As mentioned in FIG. 4A, light may be emitted by the leakage current on the fence 5 until the charge generation layer is completely disconnected in the trench T. Since the light emission is caused by the leakage current, yellow-green light may be emitted by the yellow-green light emitting layer of the second stack 63 on the charge generation layer. Therefore, the yellow-green light due to the leakage current may degrade color purity of the subpixel emitting light.

In the display apparatus 1 according to one aspect of the present disclosure, since the second filters 912 and 912' disposed on the lower surface of the first filters 911 and 911' are disposed to overlap the fence 5 in the thickness direction Z of the substrate 2, the light emitted by the leakage current on the fence 5 may be blocked or the light transmittance may be lowered. Therefore, in the display apparatus 1 according to one aspect of the present disclosure, even though the second subpixel SP1' emitting light of the same color as that of the first subpixel SP1 is provided in a stripe shape, since the second filter of each of the first subpixel SP1 and the second subpixel SP1' may block light emitted by the leakage current or reduce light transmittance, color purity of the subpixel emitting light may be relatively improved.

According to the present disclosure, the following advantageous effects may be obtained.

In the present disclosure, the second filter is disposed on the second electrode at a distance shorter than that of the first filter and the second filter is disposed on the lower surface of the first filter to surround the edge of the first filter, so that the distance between the light emitting layer and the color filter may be minimized, whereby a color mixture between adjacent subpixels may be avoided.

In addition, in the present disclosure, since the encapsulation layer of a low refractive index is provided between the second filters of the respective subpixels, the light directed to the adjacent subpixel may be converted to the front surface, whereby luminance may be improved.

Also, in the present disclosure, since the color filter overlapped with the non-light emission area (or fence) of each subpixel is provided to be thicker than the color filter disposed in the light emission area, even though light of another color is emitted from the non-light emission area due to the leakage current, the color filter provided to be thick in the non-light emission area may block the light, whereby color purity of the subpixel emitting light may be improved.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, it is intended that all variations or modifications derived from the meaning, scope and equivalent concept of the claims fall within the scope of the present disclosure.

What is claimed is:
1. A display apparatus comprising:
a substrate provided with a plurality of subpixels;
a first electrode provided in each of the plurality of subpixels on the substrate;
a fence provided for each of the plurality of subpixels and surrounding an edge of the first electrode;
a light emitting layer provided on the first electrode and the fence;
a second electrode provided on the light emitting layer; and
a color filter provided in each of the plurality of subpixels on the second electrode,
wherein the color filter includes a first filter spaced apart from the second electrode at a first distance, and a second filter spaced apart from the second electrode at a second distance shorter than the first distance, and wherein the second filter is disposed on a lower surface of the first filter and surrounds an edge of the first filter.

2. The display apparatus of claim 1, wherein at least a portion of the second filter overlaps with the fence.

3. The display apparatus of claim 1, wherein the second filters disposed in adjacent subpixels are spaced apart from each other.

4. The display apparatus of claim 1, wherein the first filter and the second filter disposed in a same subpixel allow light of a same color to transmit therethrough.

5. The display apparatus of claim 1, wherein the second filter has a width smaller than the fence.

6. The display apparatus of claim 1, further comprising an encapsulation layer disposed between the second electrode and the color filter,
wherein the second filter has a thickness of smaller than the encapsulation layer.

7. The display apparatus of claim 1, further comprising:
an encapsulation layer disposed between the second electrode and the color filter; and
a boundary layer disposed at a boundary portion between the plurality of subpixels,
wherein the boundary layer is in contact with a side surface of the second filter.

8. The display apparatus of claim 7, wherein the boundary layer has a refractive index smaller than the second filter.

9. The display apparatus of claim 7, wherein the boundary layer is a portion of the encapsulation layer.

10. The display apparatus of claim 7, further comprising an insulating layer disposed below the first electrode,
wherein the insulating layer includes a trench provided at a boundary portion between the plurality of subpixels, and
wherein the boundary layer overlaps with the trench.

11. The display apparatus of claim 10, wherein the fence is disposed on both sides of the trench and does not overlap with the trench.

12. The display apparatus of claim 7, wherein the boundary layer has a width wider than the trench.

13. The display apparatus of claim 10, wherein the second filter does not overlap with the trench.

14. The display apparatus of claim 7, wherein a width of the boundary layer becomes narrower as the boundary layer becomes far away from the second electrode.

15. The display apparatus of claim 1, further comprising:
an encapsulation layer disposed between the second electrode and the color filter; and
a sub layer disposed between the encapsulation layer and the color filter,
wherein the sub layer is made of an anti-moisture permeation material.

16. The display apparatus of claim 1, wherein the plurality of subpixels include a first subpixel and a second subpixel disposed to be adjacent to the first subpixel,
the second filter is provided in each of the first subpixel and the second subpixel, and
the first subpixel and the second subpixel are provided to emit light of a same color or different colors.

17. A display apparatus comprising:
a substrate provided with a plurality of subpixels;
a first electrode provided in each of the plurality of subpixels on the substrate;
a fence provided for each of the plurality of subpixels and surrounding an edge of the first electrode;
a light emitting layer provided on the first electrode and the fence;
a second electrode provided on the light emitting layer;
an encapsulation layer disposed on the second electrode; and
a color filter provided in each of the plurality of subpixels on the encapsulation layer,
wherein the color filter includes a first filter wider than the first electrode, and a second filter disposed on a lower surface of the first filter and narrower than the first filter, and
wherein the encapsulation layer surrounds the second filter.

18. The display apparatus of claim 17, wherein at least a portion of the second filter overlaps with the fence.

19. The display apparatus of claim 17, wherein the encapsulation layer has a refractive index smaller than the second filter.

20. The display apparatus of claim 17, wherein the second filters of the subpixels are disposed to be spaced apart from each other at a boundary portion between the plurality of subpixels with the encapsulation layer interposed therebetween.

* * * * *